(12) United States Patent  
Casey et al.

(10) Patent No.: US 8,633,734 B2  
(45) Date of Patent: Jan. 21, 2014

(54) BI-DIRECTIONAL COMPARATOR

(75) Inventors: Charles A. Casey, Doylestown, PA (US); Richard Zhu, Somerset, NJ (US); Cameron Jackson, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 13/517,587

(22) Filed: Jun. 13, 2012

(65) Prior Publication Data

US 2013/0335119 A1 Dec. 19, 2013

(51) Int. Cl.  
*H03K 5/22* (2006.01)

(52) U.S. Cl.  
USPC .................. 327/63; 327/67; 327/205

(58) Field of Classification Search  
USPC ............... 327/63, 64, 65, 67, 124, 205, 206  
See application file for complete search history.

(56) References Cited

U.S. PATENT DOCUMENTS

| 6,229,350 | B1 | 5/2001 | Ricon-Mora | |
| 7,087,223 | B2 * | 8/2006 | Goto et al. | 424/78.12 |
| 7,187,223 | B2 * | 3/2007 | Yeo et al. | 327/206 |
| 7,236,030 | B2 | 6/2007 | Price, Jr. | 327/205 |
| 7,595,676 | B2 * | 9/2009 | Trifonov | 327/206 |
| 7,893,768 | B2 * | 2/2011 | Wang et al. | 330/279 |
| 7,902,894 | B2 | 3/2011 | Mohtashemi | |
| 8,269,527 | B2 * | 9/2012 | Ueda | 327/65 |

* cited by examiner

*Primary Examiner* — Patrick O'Neill  
*Assistant Examiner* — Afework Demisse  
(74) *Attorney, Agent, or Firm* — Van Pelt, Yi & James LLP

(57) ABSTRACT

A bi-directional comparator compares two input signals and applies a hysteresis level to the smaller input signal only after the output signal switches logical states and when the two input signals are within a predetermined range of each other. In one embodiment, the hysteresis applied to the smaller input signal is removed when the two input signals are no longer within the predetermined range of each other.

15 Claims, 5 Drawing Sheets

|  | INAH | INBH | FF Output | COMP1 Output | Hysteresis Setting |
|---|---|---|---|---|---|
| INB>INA Outside Range INB>INA+ΔV or INA<INB-ΔV | L | H | Q=1 (Set) | OUT=0 | rm_hyA=1 rm_hyB=1 (All Hysteresis removed) |
| INA → > INB and INA and INB within ΔV of each other | L | L | Q=1 (Unchange) | OUT=1 | rm_hyA=1 rm_hyB=0 (Hysteresis applied to INB) |
| INA>INB Outside Range INA>INB+ΔV or INB<INA-ΔV | H | L | Q=0 (Reset) | OUT=1 | rm_hyA=1 rm_hyB=1 (All Hysteresis removed) |
| INB → > INA and INA and INB within ΔV of each other | L | L | Q=0 (Unchange) | OUT=0 | rm_hyA=0 rm_hyB=1 (Hysteresis applied to INA) |

BI-DIRECTIONAL COMPARATOR

FIELD OF THE INVENTION

The invention relates to bi-directional comparators and, in particular, to a bi-directional comparator with accurate thresholds and hysteresis in both rising and falling directions

DESCRIPTION OF THE RELATED ART

A dual input power selector, also referred to as a "diode OR'ing controller", is typically used in a hot swap device which receive two input power supplies to select the higher of the two as the output power supply in an automatic switch over mode. For example, the two input power supplies may be a plug-in power supply, a USB power source, or battery power supply. The power selector selects the higher of the two power supplies and connects the selected input power supply to a common output node.

To avoid chattering of the output signal when the two input signals are closed in values, conventional power selectors are implemented using a hysteretic comparator. FIG. 1 is a duplicate of Figure A2 of U.S. Pat. No. 7,902,894 and illustrates the signal input/output characteristics of a hysteretic comparator. In a conventional hysteretic comparator, the comparison threshold $VIN_B(V_{REF})$ is guard banded by hysteresis $\Delta V$ on both sides. Thus, as the input voltage $VIN_A$ increases, the voltage $VIN_A$ has to increase pass $V_{REF}+\Delta V$ in order for the output VOT to switch. Similarly, when input voltage $VIN_A$ decreases, the voltage $VIN_A$ has to increase pass $V_{REF}-\Delta V$ in order for the output VOT to switch.

When a power selector is implemented using a hysteretic comparator, the hysteresis $\Delta V$ added to both sides of the comparison threshold $V_{REF}$ creates an offset in the comparison threshold. Such comparison offset is undesirable in power selectors.

SUMMARY OF THE INVENTION

According to one embodiment of the present invention, a method for comparing two input signals includes receiving a first input signal and a second input signal; comparing the first and second input signals; generating an output signal having a first logical state indicating the second input signal is greater than the first input signal and having a second logical state indicating the first input signal is greater than the second input signal; when the output signal switches logical state, introducing a hysteresis to the first or second input signal that is the smaller input signal after the output signal switches logical states; and keeping the hysteresis on the smaller input signal when the first and second input signals are within a given signal range of each other.

According to another aspect of the present invention, a bi-directional comparator includes a first comparison circuit configured to receive a first input signal and a second input signal and to compare the first and second input signals where the first comparator generates an output signal having a first logical state indicating the second input signal is greater than the first input signal and having a second logical state indicating the first input signal is greater than the second input signal; and a second comparison circuit configured to receive the first and second input signals. When the output signal switches logical state, the second comparison circuit is configured to introduce a hysteresis to the first or second input signal that is the smaller input signal after the output signal switches logical states and to keep the hysteresis on the smaller input signal when the first and second input signals are within a predetermined signal range of each other.

The present invention is better understood upon consideration of the detailed description below and the accompanying drawings.

BRIEF DESCRIPTION OF THE DRAWINGS

FIG. 5 is a logical table illustrating the logical states of the auxiliary comparators in the bi-directional comparator of FIG. 4 according to one embodiment of the present invention.

DETAILED DESCRIPTION OF THE PREFERRED EMBODIMENTS

In accordance with the principles of the present invention, a bi-directional comparator compares two input signals and applies a hysteresis level only after the output signal switches logical states and when the two input signals are within a given range of each other. The hysteresis level as thus applied prevents chattering of the output signal of the comparator. In this manner, accurate comparison of the two input signals is achieved in both rising and falling directions without any comparison offset. In one embodiment, the hysteresis level is applied only to the smaller of the two input signals after the output signal switches logical states and the hysteresis level is removed after the two input signals are outside of the given range of each other. In some applications, the bi-directional comparator is applied in a power selector to select one of two input power supplies.

Figure 1:
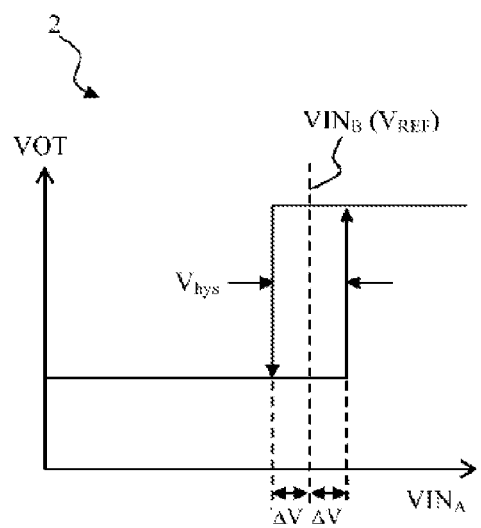
FIG. 1 is a duplicate of Figure A2 of U.S. Pat. No. 7,902,894 and illustrates the signal input/output characteristics of a hysteretic comparator.
Figure 2:
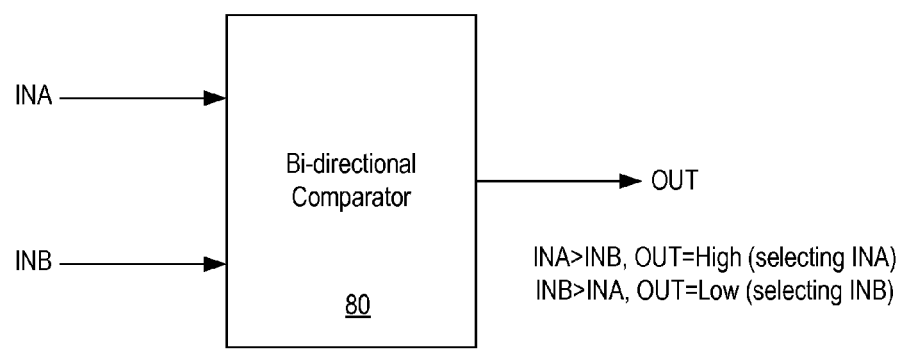
FIG. 2 is a block diagram of a bi-directional comparator according to one embodiment of the present invention.

FIG. 2 is a block diagram of a bi-directional comparator according to one embodiment of the present invention. Referring to FIG. 2, a bi-directional comparator 80 receives two input signals INA and INB and generates an output signal OUT having a logical state for selecting the greater of the two input signals. The two input signals can be a voltage signal or a current signal. In operation, when signal INA is greater than signal INB, the output signal OUT will have a first logical state (e.g. logical high) to indicate selection of input signal INA. When signal INB is greater than INA, then the output signal OUT will have a second logical state (e.g. logical low) to indicate selection of input signal INB. In embodiments of the present invention, the bi-directional comparator 80 introduces a hysteresis level to the smaller input signal after the output signal OUT switches logical states and when the two input signals are within a given signal range of each other. In this manner, the bi-directional comparator 80 can perform comparisons without any comparison offset. However, once the comparator switches logical states, a hysteresis level is added to the input signal that is now smaller to prevent chattering of the output signal. The hysteresis level is a negative hysteresis level which lowers the comparison threshold. In this manner, if the larger of the input signals drifts in signal magnitude, the comparator output signal OUT will not switch logical states unless the drifting input signal varies by more than the hysteresis level. When the input signals are outside of the given signal range, the hysteresis level is removed and the comparator 80 operates with no comparison offset until the output signal OUT switches logical states again.

Figure 3:
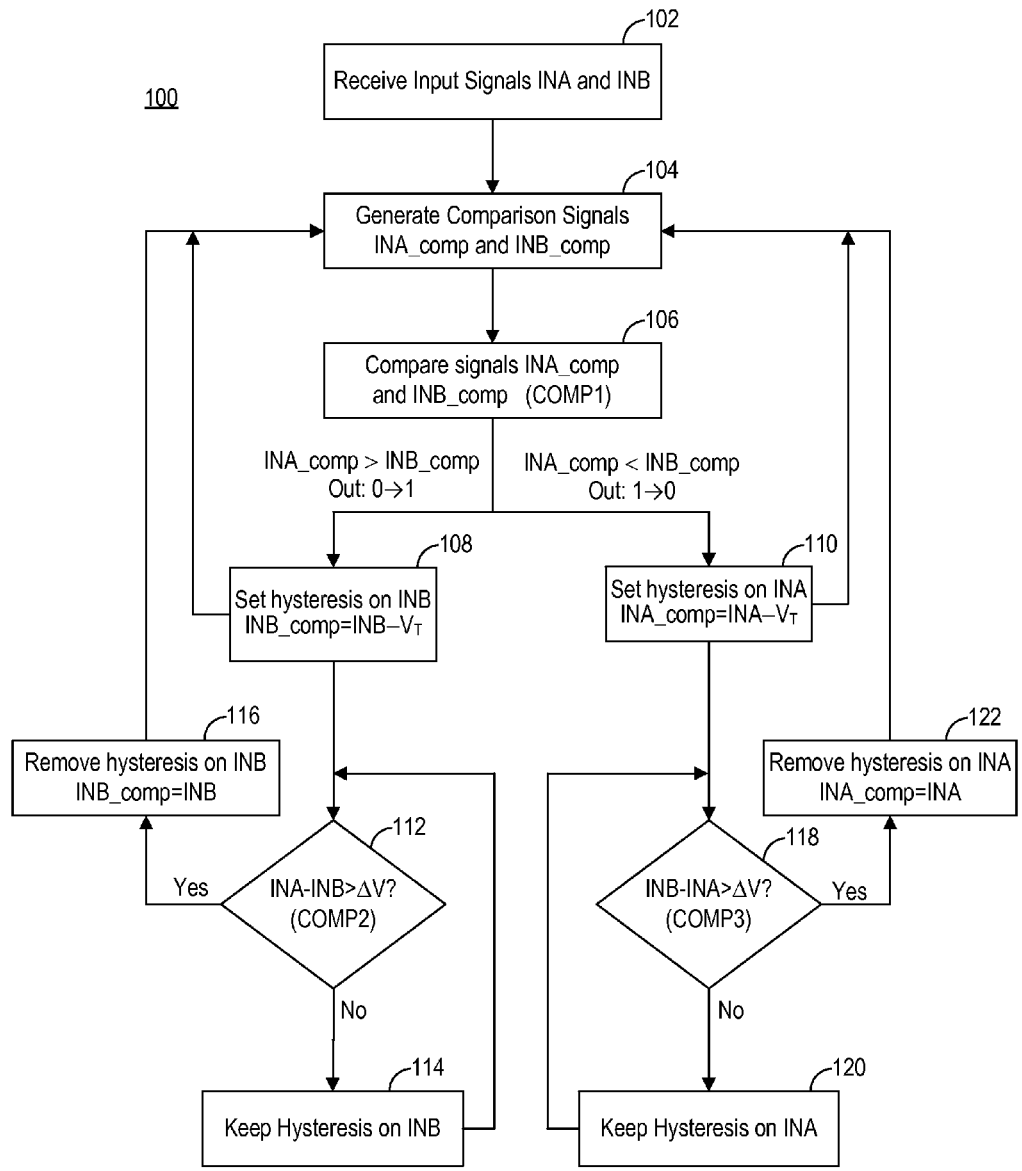
FIG. 3 is a flowchart illustrating a bi-directional comparison method which can be implemented in the bi-directional comparator of FIG. 2 according to one embodiment of the present invention.

FIG. 3 is a flowchart illustrating a bi-directional comparison method which can be implemented in the bi-directional comparator of FIG. 2 according to one embodiment of the present invention. In the present embodiment, the input signals are assumed to be voltage signals. The bi-directional comparison method can be applied to input signals that are current signals in other embodiments of the present invention. Referring to FIG. 3, a bi-directional comparison method 100 receives two input signals INA and INB (step 102). The method 100 then generates two comparison signals INA_comp and INB_comp based on the input signals (step 104). The INA_comp signal is generated based on the input signal INA and the INB_comp signal is generated based on the input signal INB. When no hysteresis is applied, comparison signal INA_comp=INA and comparison signal INB_comp=INB. When hysteresis, in the form of a negative threshold, is to be applied, comparison signal INA_comp is a threshold level below signal INA and comparison signal INB_comp is a threshold level below signal INB. The method 100 then compares the two comparison signals INA_comp and INB_comp (step 106). In some embodiments, the comparison step 106 is performed by a main comparator COMP1.

When signal INA_comp becomes greater than signal INB_comp, the comparison output signal OUT switches logical states from a logical low to a logical high. In that case, the method 100 introduces a hysteresis to input signal INB which is now the smaller input signal (step 108). More specifically, the hysteresis in the form of a negative threshold is added to the input signal INB by setting the comparison signal INB_comp a threshold $V_T$ lower than the input signal INB. That is, the signal INB_comp is set to INB-$V_T$.

When signal INB_comp becomes greater than signal INA_comp, the comparison output signal OUT switches logical states from a logical high to a logical low. In that case, the method 100 introduces a hysteresis to input signal INA which is now the smaller input signal (step 110). More specifically, the hysteresis in the form of a negative threshold is added to the input signal INA by setting the comparison signal INA_comp a threshold $V_T$ lower than the input signal INA. That is, the signal INA_comp is set to INA-$V_T$. From steps 108 and 110, the method 100 then returns to step 104 where the comparison output signals are being generated for use in the comparison step 106.

Meanwhile, method 100 proceeds to monitoring the two input signals to determine if they are within a given range of each other. To that end, from step 108, method 100 performs a second comparison step to determine if the difference between INA and INB (INA-INB) is greater than a given signal range ΔV (step 112). In some embodiments, the second comparison step 112 may be performed by a comparator COMP2. When INA-INB is greater than the given signal range ΔV, the hysteresis introduced on input signal INB is removed and the comparison signal INB_comp is now set equal to INB (step 116). When INA-INB is within the given signal range ΔV, the hysteresis applied to signal INB is kept (step 114) and method 100 continues to monitor whether INA-INB is still within the given signal range ΔV.

From step 110, method 100 performs a third comparison step to determine if the difference between INB and INA (INB-INA) is greater than the given signal range ΔV (step 118). In some embodiments, the third comparison step 118 may be performed by a comparator COMP3. When INB-INA is greater than the given signal range ΔV, the hysteresis introduced on input signal INA is removed and the comparison signal INA_comp is now equal to INA (step 122). When INB-INA is within the given signal range ΔV, the hysteresis applied to signal INA is kept (step 120) and method 100 continues to monitor whether INB-INA is still within the given signal range ΔV. When the input signals are outside of the given range ΔV of each other and the hysteresis is removed (step 116 or 122), method 100 returns to step 104 where the comparison output signals are being generated for use in the comparison step 106.

Figure 4:
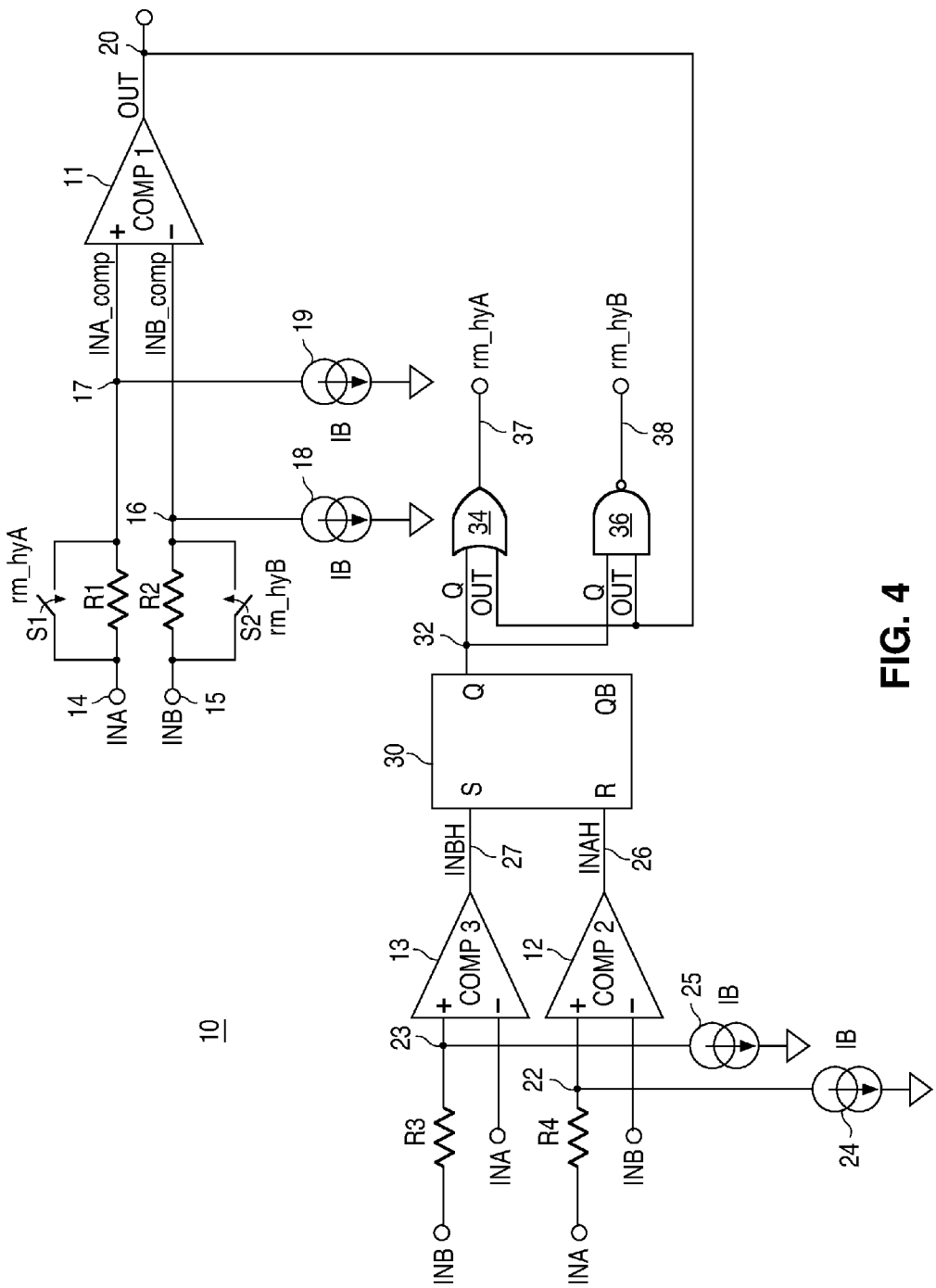
FIG. 4 is a schematic diagram of a bi-directional comparator according to one embodiment of the present invention.

FIG. 4 is a schematic diagram of a bi-directional comparator according to one embodiment of the present invention. Referring to FIG. 4, a bi-directional comparator 10 includes a main comparator 11 (COMP1) and an auxiliary comparison circuit including a pair of comparators 12 and 13 (COMP2 and COMP3) and a flip-flop 30. The main comparator 11 is coupled to receive the input signals INA and INB (nodes 14, 15 respectively) and to generate an output signal OUT (node 20). In the present embodiment, input signals INA and INB are voltage signals. In other embodiments, the input signals INA and INB can be current signals. The input signals INA and INB are coupled to the main comparator 11 through respective resistors R1 and R2 to generate comparison signals INA_comp and INB_comp (nodes 17, 18 respectively). Resistors R1 and R2 are used to introduce a negative hysteresis to the input signals when hysteresis is activated, as described below. The input voltages received at the input terminals of the main comparator 11 are the comparison signals INA_comp (at the positive input terminal 17) and INB_comp (at the negative input terminal 16).

A current source 19 is connected to node 17 to supply a current IB to resistor R1. A switch S1 is connected in parallel with resistor R1. When switch S1 is open, the current IB flows in resistor R1 and the voltage level of comparison signal INA_comp (node 17) is pull down by a voltage amount $V_T$ as a function of the resistance of resistor R1 and current IB, that is $V_T$=R1*IB. A negative threshold or hysteresis is added to the input signal INA by setting the comparison signal INA_comp a threshold level below the input signal INA. When switch S1 is closed, resistor R1 is bypassed and the comparison signal INA_comp is equal to the input signal INA. The switch S1 is controlled by a signal rm_hyA which is asserted to close switch S1 when the hysteresis on input signal INA is to be removed. In the present embodiment, the switch resistance is assumed to be 0.

A current source 18 is connected to node 16 to supply a current IB to resistor R2. A switch S2 is connected in parallel with resistor R2. When switch S2 is open, the current IB flows in resistor R2 and the voltage level of comparison signal INB_comp (node 16) is pull down by a voltage amount $V_T$ as a function of the resistance of resistor R2 and current IB, that is $V_T$=R2*IB. A negative threshold or hysteresis is added to the input signal INB by setting the comparison signal INB_comp a threshold level below the input signal INB. When switch S2 is closed, resistor R2 is bypassed and the comparison signal INB_comp is equal to the input signal INB. The switch S2 is controlled by a signal rm_hyB which is asserted to close switch S2 when the hysteresis on input signal INB is to be removed. In the present embodiment, the switch resistance is assumed to be 0.

The comparators in the auxiliary comparison circuit are also coupled to receive the input signals INA and INB. At comparator 12, the input signal INA is coupled through a resistor R4 to the positive input terminal 22 while the input signal INB is coupled directly to the negative input terminal of the comparator 12. At comparator 13, the input signal INB is coupled through a resistor R3 to the positive input terminal 23 while the input signal INA is coupled directly to the negative input terminal of the comparator. A current source 24 is connected to node 22 to supply a current IB to resistor R4. A current source 25 is connected to node 23 to supply a current IB to resistor R3. When a current IB flows through resistor R3 or resistor R4, the voltage at the respective node (22, 23) is pull down by a voltage amount ΔV as a function of the resistance of resistor R3/4 and current IB, that is ΔV=R3/4*IB. In the embodiments of the present invention, resistors R1, R2, R3 and R4 can have the same or different resistance values. Resistors R1 and R2, together with current IB, determine the hysteresis level $V_T$ to be applied to the input signal. Resistors R3 and R4, together with current IB, determine the voltage range ΔV for applying or removing the hysteresis level $V_T$.

The comparator 12 generates an output signal INAH driving the Reset input terminal 26 of flip-flop 30. The comparator 13 generates an output signal INBH driving the Set input terminal 27 of flip-flop 30. The flip-flop 30 generates an output Q (node 32). Thus, when the signal INBH is asserted, the output Q of flip-flop 30 is asserted (logical high). When the signal INAH is asserted, the output Q of flip-flop 30 is deasserted (logical low).

The output signal OUT of the main comparator 11 and the output signal Q of flip-flop 30 are coupled to a logic circuit including an OR gate 34 and an NAND gate 36. OR gate 34 generates the rm_hyA signal which controls the removal of the hysteresis on input signal INA. NAND gate 36 generates the rm_hyB signal which controls the removal of the hysteresis on input signal INB.

The operation of the auxiliary comparators in the bi-directional comparator 10 of FIG. 4 will now be described with reference to the logical table in FIG. 5. Referring to FIGS. 4 and 5, comparators 12 and 13 determines if input signals INA and INB are within a given voltage range ΔV of each other. Comparator 12 is asserted to generate the output signal INAH having a logical high value when the input signal INA is greater than the input signal INB by the voltage range ΔV. The flip-flop 30 is in a Reset state. Comparator 13 is asserted to generate the output signal INBH having a logical high value when the input signal INB is greater than the input signal INA by the voltage range ΔV. The flip-flop 30 is in a Set state.

When input signals INA and INB are within the given voltage range ΔV of each other, both output signals INAH and INBH are at a logical low state. The flip-flop 30 does not change state when both of its inputs are at the logical low value. Thus, when the input signals INA and INB are within a voltage range ΔV of each other, the previously set logical state for output signal Q still applies.

The output signal Q of the flip-flop 30 together with the output signal OUT of the main comparator 11 are used to generate remove hysteresis control signals rm_hyA and rm_hyB. Referring to the logic table in FIG. 5, when input signal INB is greater than input signal INA by more than the given voltage range ΔV, the flip-fop 30 is in the Set state and the comparator output OUT is at a logical low. The remove hysteresis control signals rm_hyA and rm_hyB are both logical high to close switches 51 and S2. In this manner, all hysteresis on the input signals are removed and the comparison signals are the same as the input signals.

When input signal INA becomes greater than input signal INB and the two input signals are within the given voltage range ΔV, the flip-fop 30 does not change state while the comparator output OUT switches to a logical high state. The remove hysteresis control signal rm_hyA remains at a logical high while the remove hysteresis control signal rm_hyB switches to a logical low. Switch S1 remains closed while switch S2 is now open. In this manner, hysteresis is applied to the input signal INB so that the comparison signal INB_comp is now a threshold voltage level $V_T$ lower than signal INB.

When input signal INA is greater than input signal INB by more than the given voltage range ΔV, the flip-fop 30 is in the Reset state and the comparator output OUT is at a logical high. The remove hysteresis control signals rm_hyA and rm_hyB are both logical high to close switches S1 and S2. In this manner, all hysteresis on the input signals are removed and the comparison signals are the same as the input signals.

Finally, when input signal INB becomes greater than input signal INA and the two input signals are within the given voltage range ΔV, the flip-fop 30 does not change state while the comparator output OUT switches to a logical low state. The remove hysteresis control signal rm_hyB remains at a logical high while the remove hysteresis control signal rm_hyA switches to a logical low. Switch S2 remains closed while switch S1 is now open. In this manner, hysteresis is applied to the input signal INA so that the comparison signal INA_comp is now a threshold voltage level $V_T$ lower than signal INA.

Figure 6:
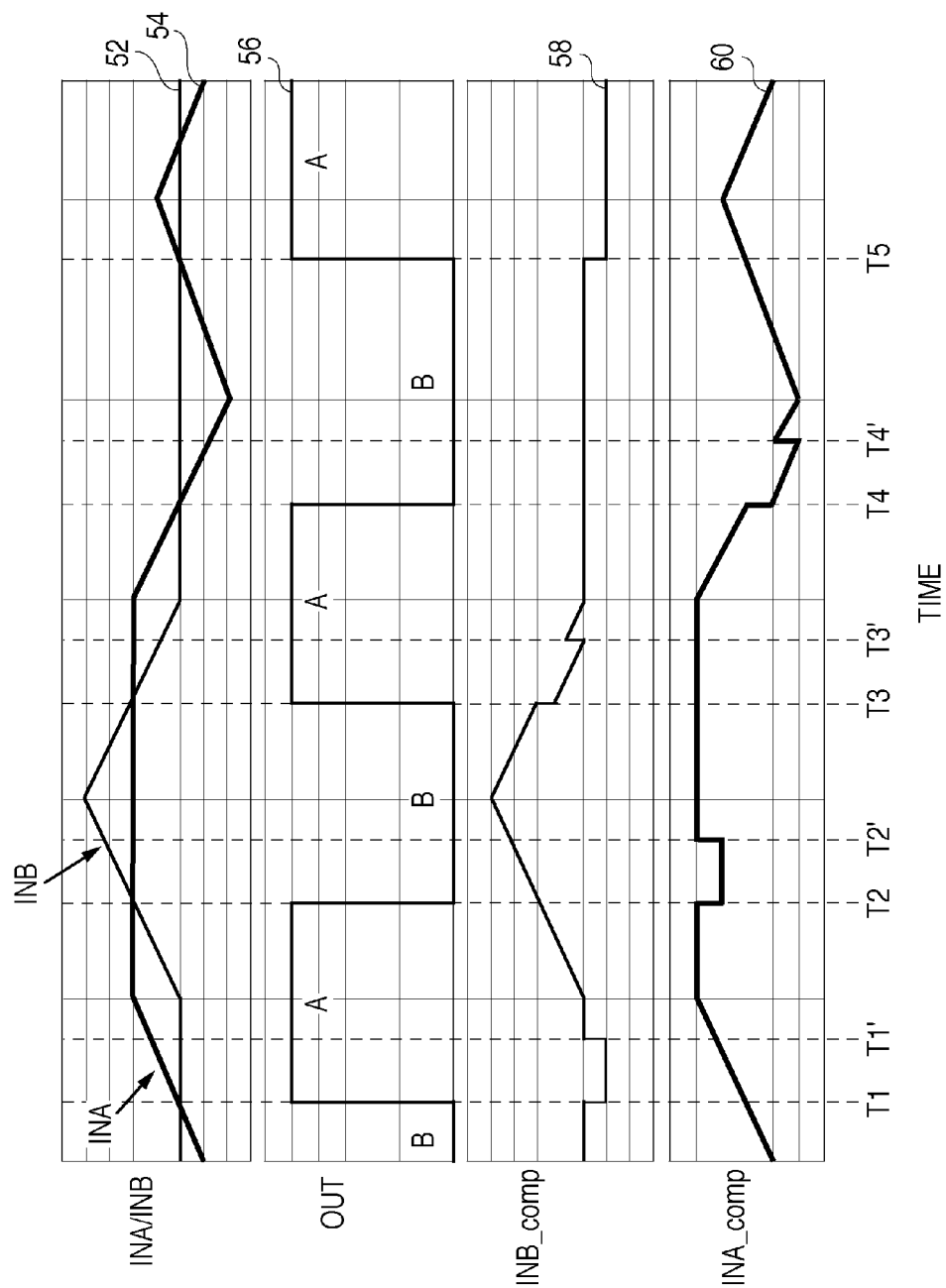
FIG. 6 is a waveform diagram illustrating the operation of the bi-directional comparator of FIG. 4 with representative input signal levels according to one embodiment of the present invention.

The operation of the bi-directional comparator 10 of FIG. 4 will be further described with reference to the waveform diagram in FIG. 6. FIG. 6 is a waveform diagram illustrating the operation of the bi-directional comparator of FIG. 4 with representative input signal levels according to one embodiment of the present invention. Referring to FIGS. 4 and 6, the input signal INA is depicted by curve 54 while the input signal INB is depicted by curve 52. The output signal OUT is depicted by curve 56. The comparison signal INB_comp at the negative input terminal 16 to the main comparator 11 is shown as curve 58 and the comparison signal INA_comp at the positive input terminal 17 to the main comparator 11 is shown as curve 60.

As shown in FIG. 6, the input signal INA is initially lower than input signal INB by more than the voltage range ΔV and input signal INA is rising towards signal INB. During the initial period before T1, the output signal OUT at the main comparator 11 is a logical low, selecting the input signal INB. Meanwhile, the comparator output INAH (comparator 12) is logical low while the comparator output INBH (comparator 13) is logical high and flip-flop 30 is in a Set state. Both remove hysteresis control signals rm_hyA and rm_hyB are asserted so that switches S1 and S2 are closed to bypass resistors R1 and R2. The main comparator 11 compares signals INA_comp and INB_comp without any hysteresis or comparison offset.

As input signal INA rises towards signal INB until the input signals INA and INB are within a voltage range ΔV of each other, the comparator 13 deasserts its output INBH. Flip-flop 30, with both inputs at a logical low, will not change state. Thus, the output Q remains asserted. When input signal INA crosses over input signal INB at time T1, the output signal OUT changes from a logical low state to a logical high state, selecting the input signal INA. When the output signal OUT changes state to a logical high state, the remove hysteresis control signal rm_hyB becomes deasserted so that switch S2 is now open. Current IB flows in resistor R2 so that the signal INB_comp is pulled down by a voltage value $V_T$ from the signal INB. In this manner, a hysteresis $V_T$ is introduced to the signal INB, as shown by the dip in the comparison signal INB_comp (curve 58) in FIG. 6. The negative threshold added to the signal INB prevents chattering of the output signal OUT when the input signal INA drifts low right after the crossover.

The hysteresis is applied to input signal INB until the two signals are no longer within the voltage range ΔV of each other, as denoted by time T1'. More specifically, when input signal INA increases beyond INB by the given voltage range ΔV, the comparator output INAH (comparator 12) is asserted to a logical high state. The flip-flop 30 is now in a Reset state and the output signal Q is deasserted. The remove hysteresis control signal rm_hyB becomes asserted (logical high) to close switch S2 and bypass resistor R2. The comparison signal INB_comp is now equal to the input signal INB.

Then, at time T2, the input signal INA has not changed but the input signal INB has now increased and has crossed over signal INA. The output signal OUT of the main comparator 11 switches to the logical low state, selecting input signal INB. The flip-flop 30 was previously set to the Reset state with the output Q at a logical low. When the output signal OUT changes state to a logical low state, the remove hysteresis control signal rm_hyA becomes deasserted so that switch S1 is now open. Current IB flows in resistor R1 so that the signal INA_comp is pulled down by a voltage value $V_T$ from the signal INA. In this manner, a hysteresis $V_T$ is introduced to the signal INA, as shown by the dip in the comparison signal INA_comp (curve 60) in FIG. 6. The negative threshold added to the signal INA prevents chattering of the output signal OUT when the input signal INB drifts low right after the crossover.

The hysteresis is applied to input signal INA until the two signals are no longer within the voltage range ΔV of each other, as denoted by time T2'. More specifically, when input signal INB increases beyond INA by the given voltage range ΔV, the comparator output INBH (comparator 13) is asserted to a logical high state. The flip-flop 30 is now in a Set state and the output signal Q is asserted. The remove hysteresis control signal rm_hyA becomes asserted (logical high) to close switch S1 and bypass resistor R1. The comparison signal INA_comp is now equal to the input signal INA.

The operation of the bi-directional comparator 10 continues in the same manner to apply a hysteresis to the smaller input signal after the output signal OUT changes logical state. Thus, at time T3, the input signal INB has dropped below input signal INA. The output signal OUT switches to a logical high and a hysteresis is applied to the input signal INB so that INB_comp is pulled down by a voltage value $V_T$ from the signal INB, as shown in FIG. 6. At time T3', the hysteresis is removed when the two input signals are outside of the given voltage range ΔV of each other. At time T4, the input signal INA has dropped below input signal INB. The output signal OUT switches to a logical LOW and a hysteresis is applied to the input signal INA so that INA_comp is pulled down by a voltage value $V_T$ from the signal INA, as shown in FIG. 6. At time T4', the hysteresis is removed when the two input signals are outside of the given voltage range ΔV of each other.

Finally, at time T5, the input signal INA has increased above input signal INB. The output signal OUT switches to a logical high and a hysteresis is applied to the input signal INB so that INB_comp (curve 58) is pulled down by a voltage value $V_T$ from the signal INB, as shown in FIG. 6. However, in this case, input signal INA does not increase beyond the given voltage range ΔV of input signal INB but instead has drifted to be below input signal INB. The hysteresis applied to the input signal INB persists to prevent chattering of the output signal OUT. Thus, the input signal INA has to drift below INB_comp which is INB–$V_T$ before output signal OUT can change state. Thus, the comparator output signal OUT (curve 56) remains at a logical high selecting input signal INA even though signal INA has drifted to below signal INB.

The bi-directional comparator of the present invention allows accurate comparison of the input signals in both the rising and falling directions, without any comparison offset. The comparator applies hysteresis only after the output signal changes state to prevent chattering of the output signal.

The above detailed descriptions are provided to illustrate specific embodiments of the present invention and are not intended to be limiting. Numerous modifications and variations within the scope of the present invention are possible. The present invention is defined by the appended claims.

We claim:

1. A method for comparing two input signals, comprising:
receiving a first input signal and a second input signal;
comparing the first and second input signals;
generating an output signal having a first logical state indicating the second input signal is greater than the first input signal and having a second logical state indicating the first input signal is greater than the second input signal;
in response to each logical state transition of the output signal, introducing a hysteresis to the first or second input signal that is the smaller input signal after the output signal switches logical states; and
keeping the hysteresis on the smaller input signal after each logical state transition of the output signal when the first and second input signals are within a predetermined signal range of each other, the predetermined signal range being a portion of the full signal range of the first and second input signals.

2. The method of claim 1, further comprising:
removing the hysteresis on the first input signal or the second input signal prior to the next logical state transition of the output signal when the first input signal and the second input signal are outside of the predetermined signal range of each other.

3. The method of claim 1, wherein comparing the first and second input signals and generating an output signal comprise:
generating first and second comparison signals related to the first and second input signals, respectively, the first comparison signal being the first input signal or the first input signal with hysteresis added and the second comparison signal being the second input signal or the second input signal with hysteresis added;
comparing the first and second comparison signals;
when the first comparison signal becomes greater than the second comparison signal, switching the logical state of the output signal from the first logical state to the second logical state; and
when the second comparison signal becomes greater than the first comparison signal, switching the logical state of the output signal from the second logical state to the first logical state.

4. The method of claim 3, wherein introducing a hysteresis to the first or second input signal that is the smaller input signal and keeping the hysteresis comprise:
when the output signal switches to the second logical state, adding the hysteresis to the second input signal;
when the output signal switches to the first logical state, adding the hysteresis to the first input signal; and
keeping the hysteresis on the first or second input signal when the first input signal and the second input signal are within the predetermined signal range of each other.

5. The method of claim 4, wherein adding the hysteresis to the second input signal comprises setting the second comparison signal to the second input signal less a threshold; and adding the hysteresis to the first input signal comprises setting the first comparison signal to the first input signal less a threshold.

6. The method of claim 4, further comprising:
removing the hysteresis on the first input signal or the second input signal prior to the next logical state transition of the output signal when the first input signal and the second input signal are outside of the predetermined signal range of each other.

7. The method of claim 6, wherein removing the hysteresis on the first input signal or the second input signal comprises setting the first or second comparison signal to equal to the first or second input signal, respectively.

8. A bi-directional comparator, comprising:
a first comparison circuit configured to receive a first input signal and a second input signal and to compare the first and second input signals, the first comparator generating an output signal having a first logical state indicating the second input signal is greater than the first input signal and having a second logical state indicating the first input signal is greater than the second input signal; and
a second comparison circuit configured to receive the first and second input signals and, in response to each logical state transition of the output signal, to introduce a hysteresis to the first or second input signal that is the smaller input signal after the output signal switches logical states and to keep the hysteresis on the smaller input signal after each logical state transition of the output signal when the first and second input signals are within a predetermined signal range of each other, the predetermined signal range being a portion of the full signal range of the first and second input signals.

9. The bi-directional comparator of claim 8, wherein the second comparison circuit is further configured to remove the hysteresis on the first input signal or the second input signal prior to the next logical state transition of the output signal when the first input signal and the second input signal are outside of the predetermined signal range of each other.

10. The bi-directional comparator of claim 8, wherein the first comparison circuit comprises:
a first comparator configured to receive a first comparison signal and a second comparison signal related to the first and second inputs, respectively, the first comparison signal being the first input signal or the first input signal with hysteresis added, and the second comparison signal being the second input signal or the second input signal with hysteresis added, the first comparator generating the output signal,
wherein the first comparator compares the first and second comparison signals; and when the first comparison signal becomes greater than the second comparison signal, the first comparator switches the logical state of the output signal from the first logical state to the second logical state; and when the second comparison signal becomes greater than the first comparison signal, the first comparator switches the logical state of the output signal from the second logical state to the first logical state.

11. The bi-directional comparator of claim 10, wherein the second comparison circuit is configured to add the hysteresis to the second input signal when the output signal switches to the second logical state, to add the hysteresis to the first input signal when the output signal switches to the first logical state, and to keep the hysteresis on the first input signal or the second input signal when the first input signal and the second input signal are within the predetermined signal range of each other.

12. The bi-directional comparator of claim 10, wherein the second comparison circuit adds the hysteresis to the second input signal by setting the second comparison signal to the second input signal less a threshold, and add the hysteresis to the first input signal by setting the first comparison signal to the first input signal less a threshold.

13. The bi-directional comparator of claim 10, wherein the second comparison circuit is further configured to remove the hysteresis on the first input signal or the second input signal prior to the next logical state transition of the output signal when the first input signal and the second input signal are outside of the predetermined signal range of each other.

14. The bi-directional comparator of claim 13, wherein the second comparison circuit removes the hysteresis on the first input signal or the second input signal by setting the first or second comparison signal to equal to the first or second input signal, respectively.

15. The bi-directional comparator of claim 10, wherein the second comparison circuit comprises
a second comparator configured to receive the first input signal lowered by the predetermined signal range and the second input signal, the second comparator generating an output signal indicating whether the difference between the first input signal and the second input signal is greater than the predetermined signal range;
a third comparator configured to receive the second input signal lowered by the predetermined signal range and the first input signal, the third comparator generating an output signal indicating whether the difference between the second input signal and the first input signal is greater than the predetermined signal range;
a flip-flop having a set input terminal driven by the output signal of the third comparator and a reset input terminal driven by the output signal of the second comparator, the flip-flop generating an output signal; and
a logic circuit configured to receive the output signal of the flip-flop and the output signal of the first comparator, the logic circuit generating control signals to control the addition of hysteresis to the first and second input signals.

* * * * *